US010859633B2

(12) United States Patent
Christensen

(10) Patent No.: US 10,859,633 B2
(45) Date of Patent: Dec. 8, 2020

(54) METHOD FOR UPDATING A DISCHARGE BATTERY PROFILE

(71) Applicant: Oticon A/S, Smørum (DK)

(72) Inventor: Jess Christensen, Smørum (DK)

(73) Assignee: OTICON A/S, Smørum (DK)

( * ) Notice: Subject to any disclaimer, the term of this patent is extended or adjusted under 35 U.S.C. 154(b) by 96 days.

(21) Appl. No.: 16/297,296

(22) Filed: Mar. 8, 2019

(65) Prior Publication Data

US 2019/0277921 A1    Sep. 12, 2019

(30) Foreign Application Priority Data

Mar. 9, 2018  (EP) .................................. 18160907

(51) Int. Cl.
 *G01R 19/165*  (2006.01)
 *G01R 31/3835* (2019.01)
   (Continued)

(52) U.S. Cl.
 CPC ... *G01R 31/3835* (2019.01); *G01R 19/16542* (2013.01); *G01R 31/3648* (2013.01);
   (Continued)

(58) Field of Classification Search
 CPC ............ G01R 31/3835; G01R 31/3842; G01R 31/374; G01R 31/3648; G01R 19/16542; H02J 7/0063; H04R 25/30–305
 See application file for complete search history.

(56) References Cited

U.S. PATENT DOCUMENTS 5,592,094 A    1/1997 Ichikawa
5,936,385 A *  8/1999 Patillon ................ G01R 31/367
                                              320/136
(Continued)

FOREIGN PATENT DOCUMENTS

CN    102455410 B    9/2014
CN    104614679 B    5/2017
EP    2 910 962 A1    8/2015

*Primary Examiner* — Patrick Assouad
*Assistant Examiner* — Demetrius R Pretlow
(74) *Attorney, Agent, or Firm* — Birch, Stewart, Kolasch & Birch, LLP.

(57) ABSTRACT

The disclosure presents a method and a hearing aid with an improved method for updating a discharge charging profile of a battery. The method comprises following steps;
 receiving during a first discharge step of the plurality of discharge steps a first primary battery voltage from a voltage monitor unit,
 receiving during the first discharge step a first primary charge from a charge monitor unit or a storing unit,
 determining a first secondary charge, where the first secondary charge is one or more discharge steps lower than the first primary charge,
 determining a first secondary battery voltage difference to be equal to a secondary battery voltage difference of a plurality of secondary battery voltage differences relative to the first secondary charge, wherein the plurality of secondary battery voltage differences is stored in the storing unit,
 determining a first secondary battery voltage to be equal to a secondary battery voltage of the plurality of secondary battery voltages relative to the first secondary charge,
 determining a first primary battery voltage difference between the first secondary battery voltage and the first primary battery voltage,
 determining a new battery voltage difference based on a first weight of the first primary battery voltage difference and a second weight of the first secondary battery voltage difference, and
 updating the discharge battery profile with the new battery voltage difference.

20 Claims, 7 Drawing Sheets

(51) Int. Cl.
*G01R 31/374* (2019.01)
*G01R 31/36* (2020.01)
*H04R 25/00* (2006.01)
*G01R 31/3842* (2019.01)
*H02J 7/00* (2006.01)
*G01R 31/367* (2019.01)

(52) U.S. Cl.
CPC ....... *G01R 31/374* (2019.01); *G01R 31/3842* (2019.01); *H02J 7/0063* (2013.01); *H04R 25/30* (2013.01); *G01R 31/367* (2019.01); *H04R 25/552* (2013.01); *H04R 25/554* (2013.01); *H04R 2225/31* (2013.01); *H04R 2225/33* (2013.01)

(56) References Cited

U.S. PATENT DOCUMENTS

| | | | |
|---|---|---|---|
| 6,661,231 B1 | 12/2003 | Arai et al. | |
| 2005/0248315 A1* | 11/2005 | Hartley | H01M 10/46 320/132 |
| 2006/0076929 A1* | 4/2006 | Tatsumi | G01R 31/367 320/132 |
| 2007/0123303 A1* | 5/2007 | Book | H04W 52/0277 455/557 |
| 2009/0037124 A1 | 2/2009 | Majima | |
| 2009/0312809 A1* | 12/2009 | Gandhi | A61N 1/3708 607/2 |
| 2010/0019718 A1* | 1/2010 | Salasoo | H01M 10/44 320/103 |
| 2010/0036626 A1* | 2/2010 | Kang | G01R 31/392 702/63 |
| 2013/0187657 A1* | 7/2013 | Yen | H02J 7/0078 324/427 |
| 2014/0156209 A1* | 6/2014 | Yuan | G01R 19/16542 702/63 |
| 2014/0354213 A1* | 12/2014 | Rivera-Poventud | H02J 7/00712 320/107 |
| 2016/0146899 A1* | 5/2016 | Teng | G01R 31/367 324/431 |
| 2016/0241968 A1 | 8/2016 | Hatanaka et al. | |
| 2017/0001534 A1* | 1/2017 | Cho | B60L 7/18 |
| 2017/0271912 A1* | 9/2017 | Bhowmik | H02J 3/381 |
| 2018/0261889 A1* | 9/2018 | Kusano | G01R 31/3842 |
| 2018/0261893 A1* | 9/2018 | Fujita | H02J 7/0069 |
| 2018/0292465 A1* | 10/2018 | Osara | G01M 5/0033 |
| 2019/0178951 A1* | 6/2019 | Cha | G01R 31/389 |
| 2019/0257890 A1* | 8/2019 | Cha | G01R 31/3842 |
| 2019/0267815 A1* | 8/2019 | Hidaka | H01M 10/486 |
| 2020/0003842 A1* | 1/2020 | Nishikawa | B60L 3/12 |
| 2020/0150183 A1* | 5/2020 | Yoon | G01R 31/36 |
| 2020/0191872 A1* | 6/2020 | Song | H02J 7/00 |

* cited by examiner

METHOD FOR UPDATING A DISCHARGE BATTERY PROFILE

TECHNICAL FIELD

The disclosure relates to a method and a hearing aid with an improved method for updating a discharge battery profile.

BACKGROUND

It is crucial for any user of a wearable device that an indication of a remaining charge capacity of a battery is trustworthy and precise, and furthermore, it is known that a charge capacity or the performance of the battery degrades during the life time of the battery.

In order to estimate the charge capacity or the remaining charge capacity, a discharge battery profile of the specific battery in the wearable device is needed, and during the lifetime of the battery the discharge battery profile becomes less precise.

Furthermore, if a user of the wearable device decides to change the battery to a different type of battery, e.g. a different vendor, then the discharge battery profile pre-stored in the wearable device becomes less precise. In this situation, the user of the wearable device has to update the discharge battery profile relating to the new battery.

The wearable device could for example be a hearing aid, and in this situation, it is very important for the user of the hearing aid to know when going away from the charger back home whether there is enough remaining battery capacity in the hearing aid. If the hearing aid suddenly turns off, the user will become very vulnerable if not able to hear the surroundings. Therefore, it is especially important for the user of the hearing aid to trust the indication of the remaining charge capacity and indirectly also the charge capacity.

Therefore, an improved method for estimating the charge capacity and the remaining charge capacity is needed.

SUMMARY

An aspect of the present disclosure is to provide a method and a hearing aid with an improved method for updating a discharge battery profile which leads to a more accurate estimation of a charge capacity of a rechargeable battery.

Furthermore, the method provides a more reliable indication of the remaining battery charge and current charge capacity of the battery to a user of, e.g. a hearing aid.

By determining the charge capacity then it is possible to estimate when the battery needs to be changed. This information can be send to an app installed on a smartphone or transmitted acoustically to the ear of a user of a hearing aid configured to processor the disclosed method.

The battery may be a rechargeable battery, such as a Li-Ion battery.

Furthermore, the method allows the use of different battery vendors and technology updates without degrading performance of determining the charge capacity or remaining battery charge. The user of for example a hearing aid configured to perform the method, does not need to manually update the discharge battery profile, this is accomplished continuously while the hearing aid is turned on.

An aspect of the present disclosure is achieved by a method for updating a discharge battery profile of a battery during a plurality of discharge steps, wherein the discharge battery profile comprises a plurality of secondary battery voltages and a plurality of secondary charges.

The plurality of secondary battery voltages are stored values of measured output voltages supplied by the battery relative to charges of the battery, i.e. the plurality of secondary charges. The charges may be expressed as Coulomb, where one Coulomb is equal to the charge transferred by a current of one ampere in one second or milliampere per hour. A secondary charge of the plurality of secondary charges is a stored value and which is relative to the stored secondary battery voltage measured at the secondary charge.

The plurality of secondary battery voltages may be determined based on a plurality of secondary battery voltage differences and a maximum battery voltage capacity, where both the plurality of secondary battery voltage differences and the maximum battery voltage capacity are stored in a storing unit. The plurality of secondary battery voltage differences is a measure of a voltage difference between a secondary battery voltage supplied by the battery relative to a secondary charge of the battery, and the maximum battery voltage capacity of the battery. A secondary battery voltage difference of the plurality of secondary battery voltage difference relative to a secondary charge is an expression of how much less of output voltage relative to the maximum battery voltage capacity the battery is able to provide after a period of time determined by the charge expressed as mAH (milli ampere hour). The maximum battery voltage capacity is an output voltage supplied by the battery at a charge equals to zero, i.e. 0 mAH, which means the battery has not been used.

For example, a secondary battery voltage of the plurality of secondary battery voltages may be equal to the maximum battery voltage capacity minus a secondary battery voltage difference of the plurality of secondary battery voltage differences relative to the secondary charge.

Furthermore, a secondary battery voltage may be based on a previously estimated secondary battery voltage minus a secondary battery voltage difference relative to the secondary charge, and where the previously estimated secondary battery voltage may be relative to a charge being less than the secondary charge. During a time period starting from a time the battery starts supplying a battery voltage, the previously estimated secondary battery voltage is estimated at a first time within the time period and the secondary battery voltage is estimated at a second time within the time period, and where the first time is before the second time. Estimation of the battery voltages involves determination of a voltage value, and the estimation of the battery voltage differences involves determination of a voltage difference between two voltage values.

The method comprising, receiving during a first discharge step a first primary battery voltage from a voltage monitor unit, and receiving a first primary charge. The first primary charge may be measured by a charge monitor unit, or the first primary charge may be received from a storing unit, where the first primary charge is a secondary charge of the plurality of secondary charges stored on the storing unit.

The first primary charge may be measured by a charge monitor unit, or the first primary charge may be received from a storing unit.

The method comprising determining a first secondary charge as being lower than the first primary charge, and determining a first secondary battery voltage difference as being a secondary battery voltage difference of a plurality of secondary battery voltage differences relative to the first secondary charge.

The determined first secondary charge can be any secondary charge values being lower than the first primary charge, for example 1 Coulomb lower or any Coulomb value between 0.1 and 5 Coulomb, or between 0.1 and 2 Coulomb.

The first secondary charge may be estimated based on the first primary charge by either a rounding off of the first primary charge to nearest integer value or by subtracting the first primary charge with a charge constant.

The plurality of secondary battery voltage differences may be stored on the storing unit.

The method comprising determining a first secondary battery voltage as being a secondary battery voltage of the plurality of secondary battery voltages relative to the first secondary charge, and determining a first primary battery voltage difference between the first secondary battery voltage and the first primary battery voltage.

The method comprising determining a new battery voltage difference based on a first weight of the first primary battery voltage difference and a second weight of the first secondary battery voltage difference, and updating the discharge battery profile with the new battery voltage difference. The updating is done by replacing the first secondary battery voltage with the new battery voltage difference in the storing unit.

The advantage of the method is that the discharge battery profile is updated based on the performance of the battery. As explained before, the performance of the battery degrades over time, and this degradation of the performance will be included in the updates of the discharge battery profile. Thereby, the user of the battery will obtain a more precise/accurate estimation of the charge capacity of the battery during the life time of the battery.

The plurality of secondary battery voltage differences and the relative plurality of secondary charges may be stored on a storing unit, and the plurality of secondary battery voltage differences may be measured or determined with a primary step size, i.e. the difference between each of the plurality of secondary charges is equal to the primary step size.

An aspect of the present disclosure is achieved by a method for updating a discharge battery profile of a battery during a plurality of discharge steps, wherein the discharge battery profile comprises a plurality of secondary battery voltages and a plurality of secondary charges, where the plurality of the secondary battery voltages includes measured battery voltage values at different secondary charge values of the plurality of secondary charges, and where the discharge battery profile is stored in a storing unit. The method comprising;
  receiving during a first discharge step of the plurality of discharge steps a first primary battery voltage from a voltage monitor unit,
  receiving during the first discharge step a first primary charge from a charge monitor unit or a storing unit,
  determining a first secondary charge, where the first secondary charge is one or more discharge steps lower than the first primary charge,
  determining a first secondary battery voltage difference to be equal to a secondary battery voltage difference of a plurality of secondary battery voltage differences relative to the first secondary charge, wherein the plurality of secondary battery voltage differences is stored in the storing unit,
  determining a first secondary battery voltage to be equal to a secondary battery voltage of the plurality of secondary battery voltages relative to the first secondary charge,
  determining (100E) a first primary battery voltage difference ($\Delta V11$) between the first secondary battery voltage (V12) and the first primary battery voltage (V11),
  determining a new battery voltage difference based on a first weight of the first primary battery voltage difference and a second weight of the first secondary battery voltage difference, and
  updating the discharge battery profile with the new battery voltage difference.

If the difference between the first secondary charge and the first primary charge is not equal to the primary step size, then it is not possible to estimate a valid first primary battery voltage difference. In this situation, the first primary charge is received from the storing unit (10), and wherein the first primary charge is equal to a secondary charge of the plurality of secondary charges relative to the first primary voltage, and the method may further comprise:
  receiving a second primary charge from the charge monitor unit during a second discharge step of the plurality of discharge steps, wherein the second primary charge is larger than the first primary charge,
  receiving a second primary battery voltage from the voltage monitor unit during the second discharge step,
  determining the first primary battery voltage difference between the first secondary battery voltage and the second primary battery voltage during or after the second discharge step, and
  determining the new battery voltage difference and updating the discharge battery profile with the new battery voltage difference relative to the second primary charge.

The discharge battery profile may be updated with the new battery voltage difference by replacing a secondary battery voltage difference of the plurality of secondary battery voltage differences relative to the first primary charge or the second primary charge with the new battery voltage difference in the storing unit. The secondary battery voltage difference may be replaced with the new battery voltage difference relative to the first primary charge in the storing unit when the difference between the first secondary charge and the first primary charge is equal to the primary step size. In the situation where the difference between the first secondary charge and the first primary charge is not equal to the primary step size then the replacement of the secondary battery voltage difference with the new battery voltage difference is relative to the second primary charge.

The updating of the discharge battery profile involves replacing a secondary battery voltage of the plurality of secondary battery voltages relative to a primary charge with a new battery voltage relative to the primary charge, such as the first primary charge or the second primary charge. Another primary charge may be determined by subtracting one or more discharge steps of the primary charge. The new battery voltage may be determined by subtracting a secondary battery voltage of the plurality of secondary battery voltages relative to the another primary charge with the new battery voltage difference relative to the primary charge.

The difference between the primary charge and the another primary charge is equal to the primary step size.

The plurality of secondary battery voltage differences and/or the plurality of secondary charges may be stored on the storing unit, i.e. the receiving of the plurality of secondary battery voltage differences and/or the plurality of secondary charges is transmitted from the storing unit, and wherein the plurality of secondary battery voltage differences may be relative to the plurality of secondary charges.

By placing the storing unit outside a hearing aid then the discharge battery profile may contain more data, i.e. the number of secondary battery voltages and the secondary charges may be higher than if the storing unit was provided in a hearing aid. Thereby, a more precise estimation of the charge capacity of the battery can be obtained.

The storing unit may be in a hearing aid, a smartphone, a cloud server, a server, a smartwatch or any kind of a wearable device.

The first primary battery voltage difference may be negative then no updating of the discharge battery profile, i.e. the updating of the discharge battery profile does only occur when the first primary battery voltage difference is positive. The advantage of applying the criteria of when to or when not to update the discharge battery profile, is that the discharge battery profile becomes more reliable because possible defects in the determination of the new battery voltage difference will not be provided to the discharge battery profile.

The discharge battery profile may be updated continuously when the first primary battery voltage difference is positive, i.e. when a hearing aid comprising a processor unit configured to perform the method is turned on then the discharge battery profile is being updated continuously if the first primary battery voltage difference is positive.

The determining of the new battery voltage difference is based on the first weight of the first primary battery voltage difference and a second weight of the first secondary battery voltage difference. The first weight and the second weight may be changing relative to a ratio between a primary battery voltage and a secondary battery voltage of the plurality of secondary battery voltages.

The first weight and the second weight may be continuously adapted depending on the ratio between the primary battery voltage and the secondary battery voltage. The adaptation is performed, for example by the processor unit in the hearing aid.

The first weight may increase and the second weight may decrease when a primary battery voltage, such as the first primary battery voltage or the second primary battery voltage, may be larger than a secondary battery voltage of the plurality of secondary battery voltages, and wherein the first weight decreases and the second weight increases when the primary battery voltage may be smaller than the secondary battery voltage of the plurality of secondary battery voltages. Thereby, any measurement errors or estimation errors of the primary battery voltage and the secondary battery voltage would have a minimal effect on the shape of the discharge battery profile, i.e. resulting in a less reliable discharge battery profile, due to the continuously adaptation of the weights.

The determining of the new battery voltage difference may be based on an equation defined as:

$$\Delta V\text{new}[n] = 1/\alpha * \Delta V1[n] + (1-\alpha)/\alpha * \Delta V2[n-1],$$

where n is a number of discharge steps, $\Delta V\text{new}[n]$ is the new battery voltage difference, $\Delta V1[n]$ is a primary battery voltage difference, such as the first primary battery voltage difference and the second primary battery voltage difference, $\Delta V2[n-1]$ is a secondary battery voltage difference, such as the first secondary battery voltage difference and the second secondary battery voltage difference, $1/\alpha$ is the first weight, W1 and $(1-\alpha)/\alpha$ is the second weight, W2, and $\alpha$ is a constant.

The number of discharge steos may be between 0.1 Coulomb to 10 Coulomb or between 1 Coulomb to 2 Coulomb.

Determining of a charge capacity of the battery may comprise;
determining whether the new battery voltage relative to a primary charge is larger than a dormant voltage threshold, where the dormant voltage threshold may be received from the storing unit,
extrapolating a final battery voltage at a relative final charge, where the relative final charge is received from the storing unit and
interpolating the charge capacity at the dormant voltage threshold between the new battery voltage and the final battery voltage.

The dormant voltage threshold and the relative final charge may both be measured values of the battery and stored in a storing unit. The values represent an ideal battery which its lifetime has not been reduced or only slightly reduced. The dormant voltage threshold defines a minimum voltage which the voltage supplied by the battery may not go below. That means, the determined new battery voltage may not be less than the dormant voltage threshold. If the new battery voltage becomes lower than the dormant voltage threshold then the battery lifetime will be reduced significantly.

The dormant voltage threshold may be pre-determined based on the maximum battery voltage. For example, in the hearing aid with the processor unit, if the new battery voltage is less than the dormant voltage threshold then the hearing aid will turn off or turned in to a low power mode where part of the components within the hearing aid is turned off.

A remaining battery capacity may be estimated by the ratio between the primary charge relative to the new battery voltage and the charge capacity Cc of the battery.

When for example the hearing aid is turned on, then the processor unit is configured to perform the updating of the discharge battery profile after N discharge steps, wherein N is larger than 3 discharge steps. Thereby, any instability in the determination of the new battery voltage difference during the first discharge steps will not be provided to the discharge battery profile.

The updating of the discharge battery profile DBP starts after N discharge steps, wherein N is larger than 3 discharge steps. A discharge step is equal to a charge transported by a constant current of one ampere in one second or of one milliampere per hour.

The determining of the new battery voltage difference may comprise a temperature correction coefficient for correcting an offset in the new battery voltage difference Vnew.

The temperature correction coefficient may be provided based on a temperature measured by a temperature sensor configured to measure the temperature at or around the battery.

The offset in the determination of the new battery voltage difference may be caused by a change in the temperature round or in the battery. The temperature correction coefficient may be stored in the storing unit.

The method may further comprise measuring or estimating of a temperature at the battery, and the updating of the discharge battery profile may stop when the temperature is below a minimum temperature threshold.

The minimum temperature threshold may be around 15° C., or between 10° C. and 15° C.

A further aspect of the present disclosure is to provide a hearing aid configured to compensate a hearing loss of a user wearing the hearing aid, wherein the hearing aid comprises, a microphone configured to receive an acoustical signal and convert the acoustical signal into an audio signal, a processor unit configured to process the audio signal with a hearing loss profile of the user, a speaker unit configured to emit the processed audio signal with the hearing loss profile into the ear of the user, a voltage monitor unit configured to measure and transmit a primary battery voltage, a charge monitor unit configured to measure and transmit a primary charge, a storing unit, and wherein the processor unit is configured to perform the method explained above.

A further effect resulting from the improved accuracy of the estimation of the charge capacity of the battery in the hearing aid is that the user of the hearing aid feels more comfortable wearing the hearing aid, since the user would not experience a surprisingly drop in the remaining battery capacity.

The hearing aid may further comprise a temperature sensor, and wherein the hearing aid is configured to correct the new battery voltage difference based on the temperature correction coefficient.

The hearing aid may comprise a charge monitor unit configured to measure and transmit a primary charge expressed as Coulomb, i.e. ampere per second or milliampere per hour.

An even further aspect of the present disclosure is to obtain an integrated circuit configured to perform the method explained above.

The integrated circuit may be built into a smartphone, a smartwatch a hearing aid, a hearing device, such as a headset or a headphone.

A hearing device may comprise the processor unit configured to perform the method explained above.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

DETAILED DESCRIPTION

Figure 1:
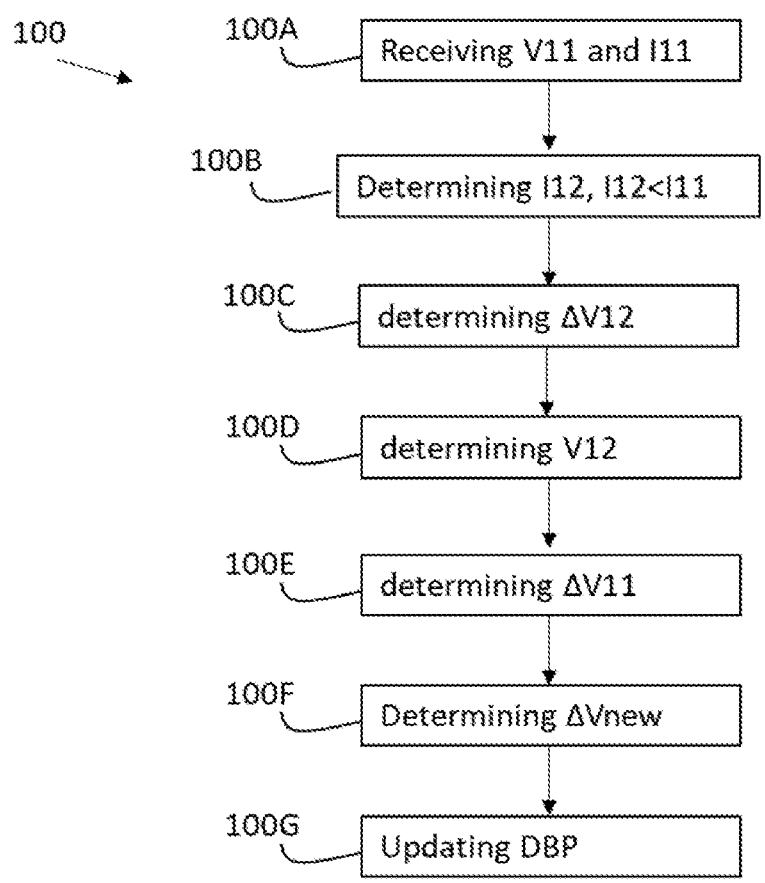
FIG. 1, illustrates a method for updating a discharge battery profile.

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

A hearing device may include a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. The "hearing device" may further refer to a device such as an earphone or a headset adapted to receive an audio signal electronically, possibly modifying the audio signal and providing the possibly modified audio signals as an audible signal to at least one of the user's ears. Such audible signals may be provided in the form of an acoustic signal radiated into the user's outer ear, or an acoustic signal transferred as mechanical vibrations to the user's inner ears through bone structure of the user's head and/or through parts of middle ear of the user or electric signals transferred directly or indirectly to cochlear nerve and/or to auditory cortex of the user.

The hearing device is adapted to be worn in any known way. This may include i) arranging a unit of the hearing device behind the ear with a tube leading air-borne acoustic signals or with a receiver/loudspeaker arranged close to or in the ear canal such as in a Behind-the-Ear type hearing aid or a Receiver-in-the Ear type hearing aid, and/or ii) arranging the hearing device entirely or partly in the pinna and/or in the ear canal of the user such as in a In-the-Ear type hearing aid or In-the-Canal/Completely-in-Canal type hearing aid, or iii) arranging a unit of the hearing device attached to a fixture implanted into the skull bone such as in Bone Anchored Hearing Aid or Cochlear Implant, or iv) arranging a unit of the hearing device as an entirely or partly implanted unit such as in Bone Anchored Hearing Aid or Cochlear Implant.

A hearing device may be part of a "hearing system", which refers to a system comprising one or two hearing devices, disclosed in present description, and a "binaural hearing system" refers to a system comprising two hearing devices where the devices are adapted to cooperatively provide audible signals to both of the user's ears. The hearing system or binaural hearing system may further include auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of remote controls, remote microphones, audio gateway devices, mobile phones, public-address systems, car audio systems or music players or a combination thereof. The audio gateway is adapted to receive a multitude of audio signals such as from an entertainment device like a TV or a music player, a telephone apparatus like a mobile telephone or a computer, a PC. The audio gateway is further adapted to select and/or combine an appropriate one of the received audio signals (or combination of signals) for transmission to the at least one hearing device. The remote control is adapted to control functionality and operation of the at least one hearing devices. The function of the remote control may be implemented in a SmartPhone or other electronic device, the SmartPhone/electronic device possibly running an application that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such directional microphone system is adapted to enhance a target acoustic source among a multitude of acoustic sources in the user's environment. In one aspect, the directional system is adapted to detect (such as adaptively detect) from which direction a particular part of the microphone signal originates. This may be achieved by using conventionally known methods. The signal processing unit may include amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a Cochlear Implant.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follows.

FIG. 1 illustrates a flow diagram describing the method 100 comprising;
  receiving 100A during a first discharge step of the plurality of discharge steps a first primary battery voltage $V11$ from a voltage monitor unit 4,
  receiving during the first discharge step a first primary charge $I11$ from the charge monitor unit 5,
  determining 100B a first secondary charge $I12$, where the first secondary charge $I12$ is one or more discharge steps lower than the first primary charge $I11$,
  determining 100C a first secondary battery voltage difference $\Delta V12$ to be equal to a secondary battery voltage difference $\Delta V2$ of a plurality of secondary battery voltage differences $\Delta V2'$ relative to the first secondary charge $I12$, wherein the plurality of secondary battery voltage differences $\Delta V2'$ are stored in the storing unit 10,
  determining 100D a first secondary battery voltage $V12$ as being a secondary battery voltage $V2$ of the plurality of secondary battery voltages $V2'$ relative to the first secondary charge $I12$,
  determining 100E a first primary battery voltage difference $\Delta V11$ between the first secondary battery voltage $V12$ and the first primary battery voltage $V11$,
  determining 100F a new battery voltage difference $\Delta Vnew$ based on a first weight $W1$ of the first primary battery voltage difference $\Delta V11$ and a second weight $W2$ of the first secondary battery voltage difference $\Delta V12$, and
  updating 100G the discharge battery profile DBP with the new battery voltage difference $\Delta Vnew$.

Figure 2:
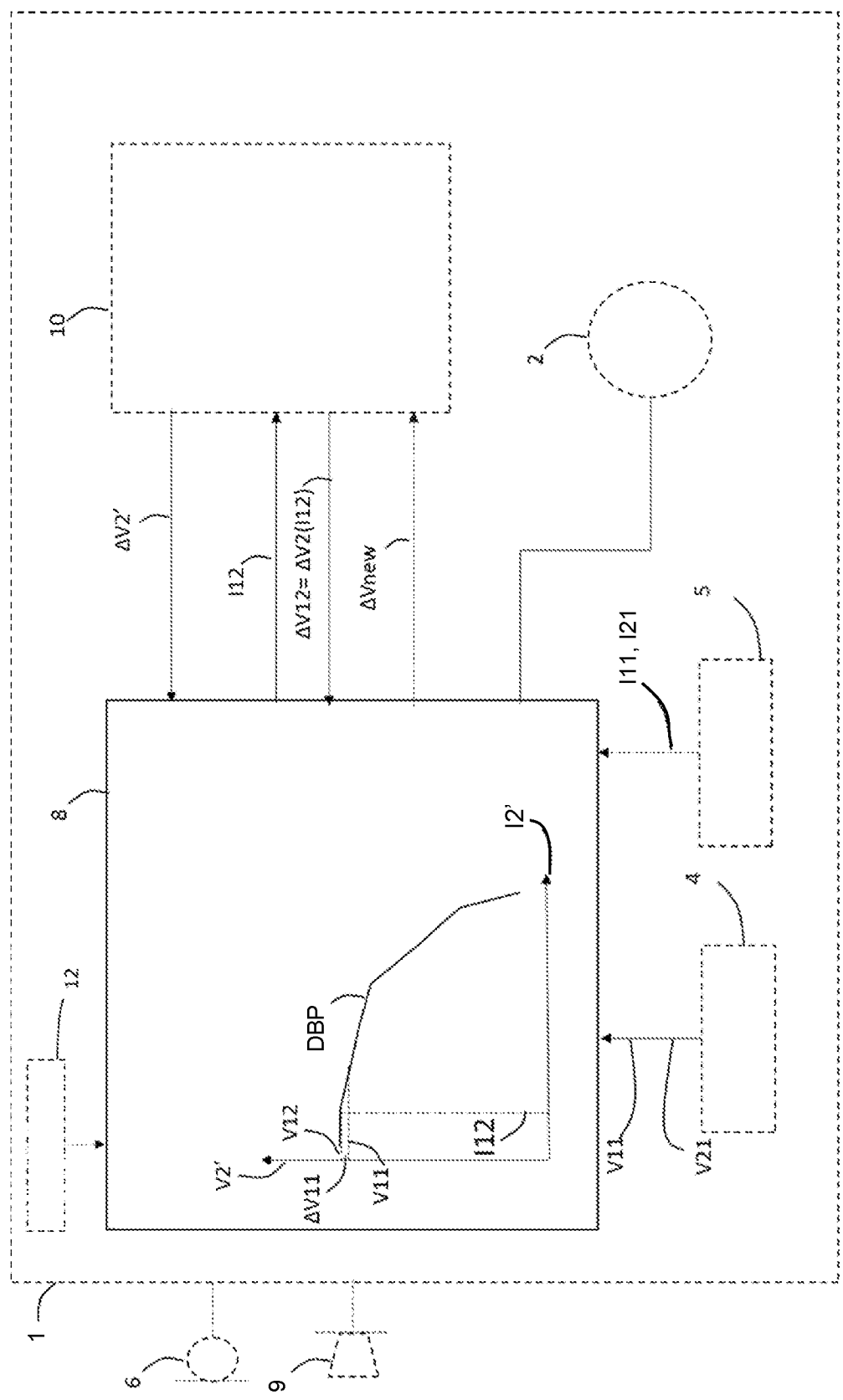
FIG. 2 illustrates an example of a hearing aid system.

FIG. 2 illustrates a hearing aid 1 configured to compensate a hearing loss of a user (3, not shown in FIG. 2) wearing the hearing aid 1. The hearing aid 1 comprises, a microphone 6 configured to receive an acoustical signal and convert the acoustical signal into an audio signal, a processor unit 8 configured to process the audio signal with a hearing loss profile of the user 3, a speaker unit 9 configured to emit the processed audio signal with the hearing loss profile into the ear of the user 3, a voltage monitor unit configured to measure and transmit a primary battery voltage $V11$, $V21$, and wherein the processor unit 8 is configured to perform the method 100. Alternatively, the hearing aid 1 may comprise a temperature sensor 12 configured to measure the temperature on or around the battery 2. Alternatively, the hearing aid 1 may comprise a charge monitor unit 5 configured to measure and transmit a primary charge $I1$, such as the first primary charge $I11$ and the second primary charge $I21$. In this specific example, the hearing aid 1 comprises a storing unit 10.

In one example, the hearing aid 1 is turned on, and during a first discharge step a first primary battery voltage $V11$ is measured via the voltage monitor unit 4. The voltage monitor unit 4 is configured to measure a battery voltage of the battery 2. The first primary battery voltage $V11$ is transmitted to the processor unit 8. Furthermore, a first primary charge $I11$ is measured by the charge monitor unit 5 and transmitted to the processor unit 8. The processor unit 8 is configured to retrieve a discharge battery profile DBP comprising a plurality of secondary battery voltages $V2'$ as a function of a plurality of secondary charges $I2'$. The secondary charges $I2'$ is received from the storing unit 10, and in one example, the processor unit 8 may receive a plurality of battery voltage differences $\Delta V2$ and a maximum battery voltage from the storing unit 10, where the plurality of secondary battery voltages $V2'$ is provided based on the plurality of battery voltage differences $\Delta V2$ and the maximum battery voltage.

Alternatively, the first primary charge $I11$ may be read out from the discharge battery profile (DBP).

The processor unit 8 is further configured to determine a first secondary charge $I12$ as being lower than the first primary charge $I11$, and relative to the first secondary charge $I12$ a first secondary battery voltage difference $\Delta V12$ is estimated by retrieving from the storing unit a secondary battery voltage difference $\Delta V2$ of a plurality of secondary battery voltage differences $\Delta V2'$ relative to the first secondary charge $I12$. Furthermore, a first secondary battery voltage $V12$ is estimated or determined via the discharge batter profile DBP as being a secondary battery voltage $V2$ of the plurality of secondary battery voltages V2' relative to the first secondary charge I12. The processor unit 8 is now able to estimate a first primary battery voltage difference ΔV11 as being a voltage difference between the first secondary battery voltage V12 and the first primary battery voltage V11.

The processor unit is further configured to determine a new battery voltage difference ΔVnew based on a first weight W1 of the first primary battery voltage difference ΔV11 and a second weight W2 of the first secondary battery voltage difference ΔV12. The processor unit may then update the discharge battery profile DBP with the new battery voltage difference ΔVnew relative to the first primary charge I11 or a second primary charge I21 being larger than the first primary charge I11.

Then if the difference between the first secondary charge and the first primary charge is not equal to the primary step size, for example between 1 charge/mAh and 3 charge/mAh, or around 1 charge/mAh, then it is not possible to estimate a valid first primary battery voltage difference ΔV11. In this situation, the first primary charge Ill may be estimated as being a secondary charge I2 of the plurality of secondary charges I2 relative to the first primary voltage V11, i.e. the processor unit 8 is configured to estimate the secondary charge I2 via the discharge battery profile DBP by determine the secondary charge relative to the first primary voltage V11. The processor unit 8 is then further configured to receive a second primary charge I21 from the charge monitor unit 5 during a second discharge step, wherein the second primary charge I21 is larger than the first primary charge I11. Furthermore, the processor unit 8 receives a second primary battery voltage V21 from the voltage monitor unit 4 during the second discharge step, and thereby, determining the first primary battery voltage difference ΔV11 between the first secondary battery voltage V12 and the second primary battery voltage V21 during or after the second discharge step. The new battery voltage difference is then determined and the discharge battery profile is updated with the new battery voltage difference relative to the second primary charge.

The determining of the new battery voltage difference ΔVnew may include a temperature correction coefficient for correcting an offset in the new battery voltage difference Vnew caused by a temperature change of the battery or around the battery. The temperature correction coefficient is based on the temperature measured by the temperature sensor 12.

The processor unit 8 may stop the updating of the discharge battery profile DBP when the temperature of the battery 2 or around the battery 2 is below a minimum temperature threshold, e.g. 15° C.

Figure 3:
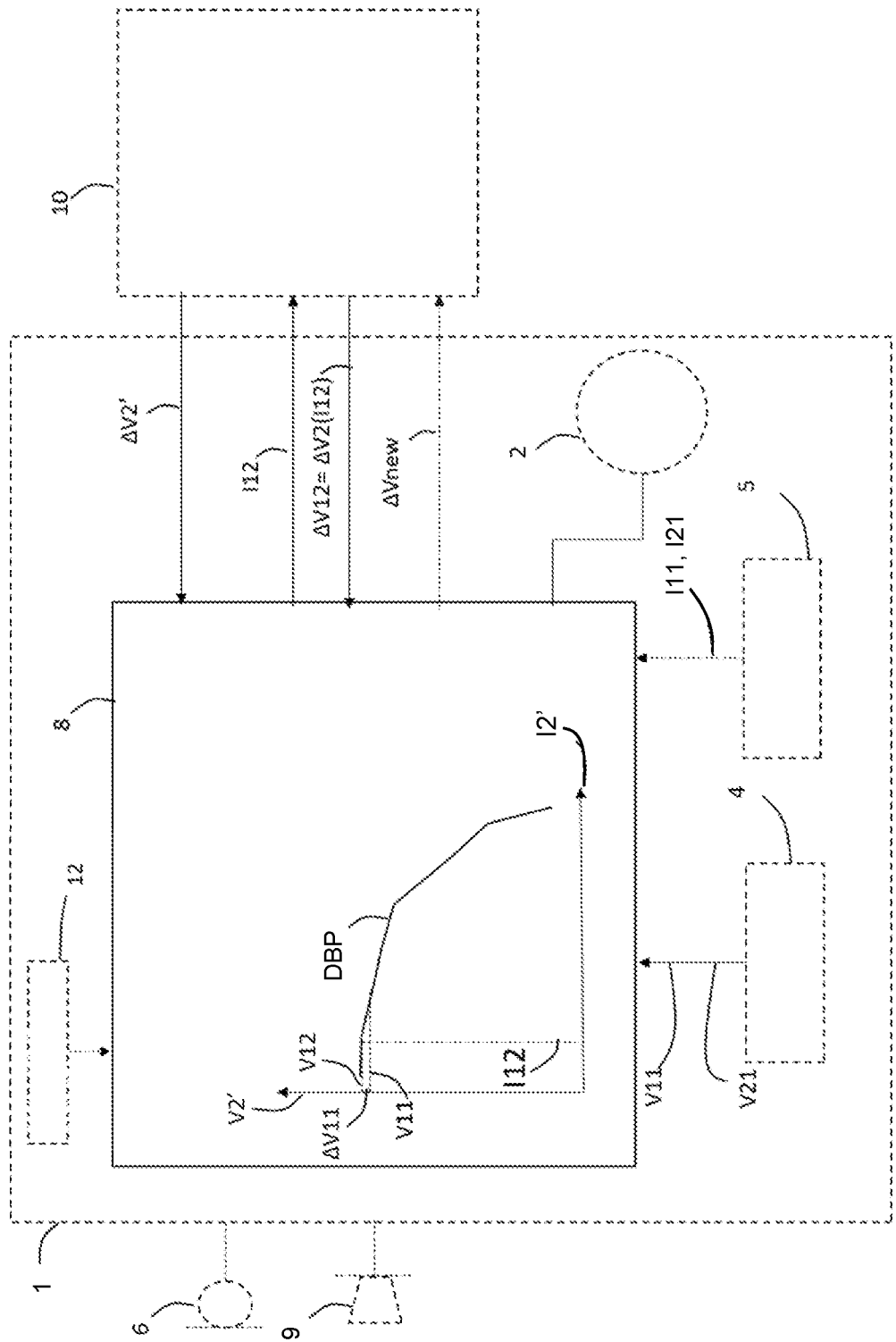
FIG. 3 illustrates a further example of a hearing aid system.

FIG. 3 shows an example of the hearing aid 1 explained in FIG. 2, but in this example the storing unit 10 is implemented in a wearable device, such as a smartphone, smartwatch, or in a server or a cloud server. The wearable device may be configured to communicate with the hearing aid wirelessly. The hearing aid may comprise an antenna and a transceiver circuit configured to communicate with wearable device(s).

Figure 4:
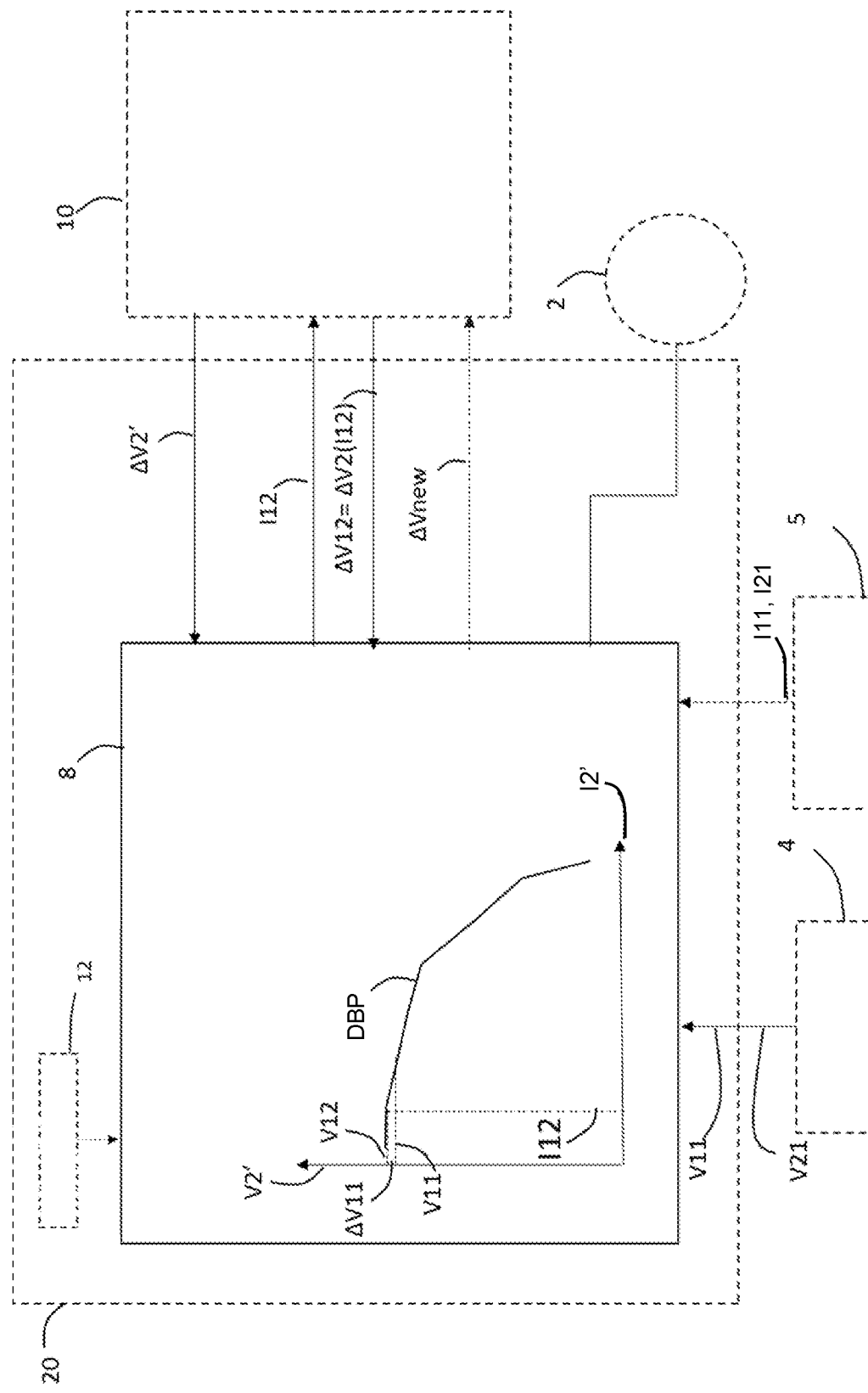
FIG. 4 illustrates another example of a hearing aid system.

FIG. 4 shows an example of an integrated circuit 20 configured to perform the method 100 as described above. In another example the integrated circuit may comprise the processor unit 8, the storing unit 10, the voltage monitor unit 4, the charge monitor unit 5 and the temperature sensor 12.

Figure 5:
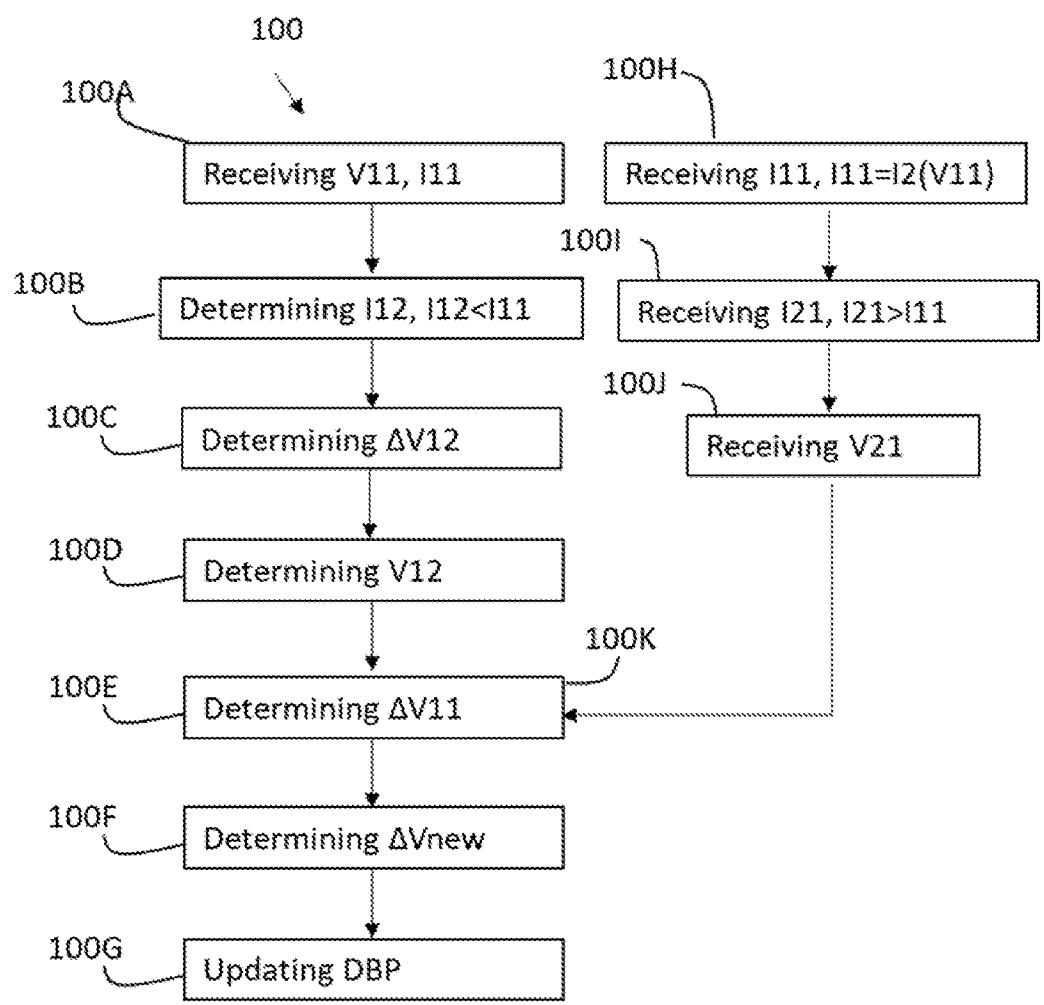
FIG. 5 shows a flow diagram explaining an update of a discharge battery profile.

Then if the difference between the first secondary charge and the first primary charge is not equal to the primary step size, for example between 1 charge/mAh and 3 charge/mAh, or around 1 charge/mAh, then it is not possible to estimate a valid first primary battery voltage difference ΔV11. FIG. 5 illustrates this situation, showing that the first primary charge I11 is received 100H from the storing unit and is equal to a secondary charge I2 of the plurality of secondary charges I2' relative to the first primary voltage V11, and that the method further comprising:

receiving 100I a second primary charge I21 from the charge monitor unit 5 during a second discharge step, wherein the second primary charge I21 is larger than the first primary charge I11, receiving 100J a second primary battery voltage V21 from the voltage monitor unit during the second discharge step, determining 100K the first primary battery voltage difference ΔV11 between the first secondary battery voltage V12 and the second primary battery voltage V21 during or after the second discharge step, and determining 100F the new battery voltage difference ΔVnew and updating 100G the discharge battery profile DBP with the new battery voltage difference ΔVnew relative to the second primary charge I21.

Figure 6:
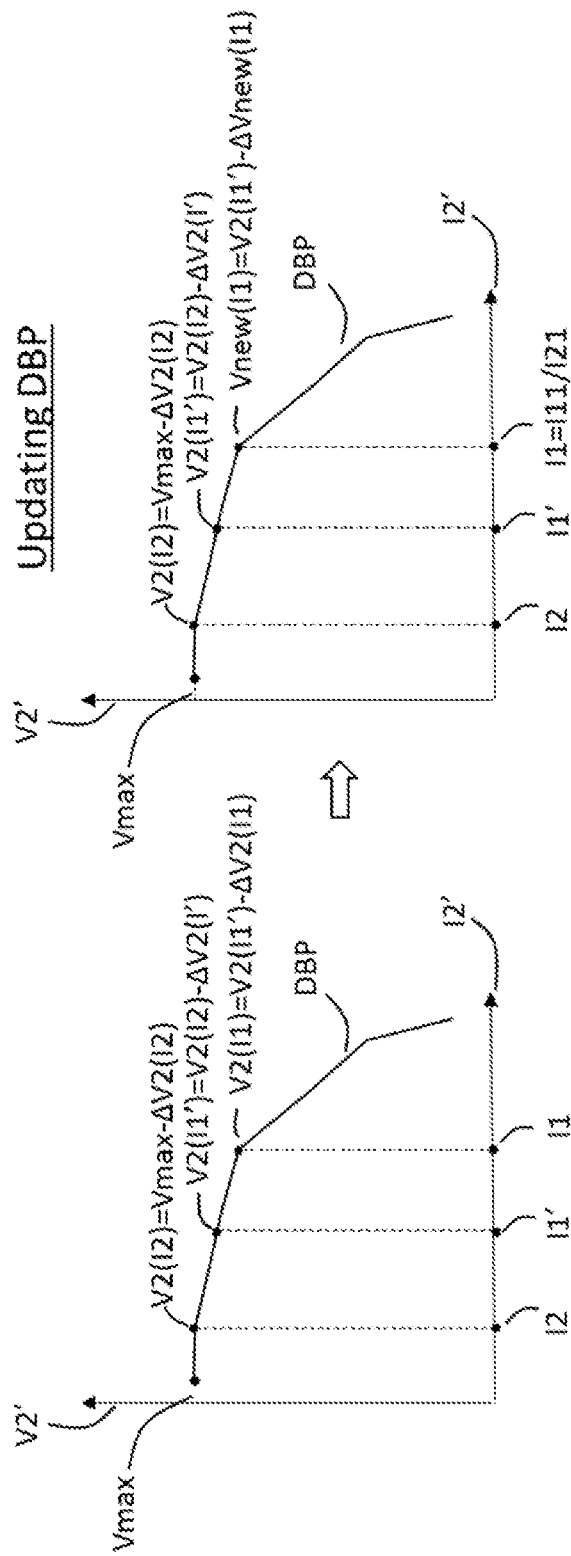
FIG. 6A illustrates an example of a discharge battery profile.
FIG. 6B illustrates an example of an update of a discharge battery profile.

FIGS. 6A and 6B illustrate how the processor unit 8 retrieves the discharge battery profile DBP and how the processor unit 8 updates the discharge battery profile DBP with the new battery voltage Vnew. In FIG. 6A the discharge battery profile includes a first point which in this specific example is a maximum battery voltage Vmax at a secondary charge. A second point is a secondary battery voltage V2 relative to a further secondary charge I2. The further secondary charge I2 is less than the secondary charge. The secondary battery voltage V2 is determined as the maximum battery voltage minus a secondary battery voltage difference ΔV2 relative to the further secondary charge I2. A third point of the discharge battery profile DBP is another secondary battery voltage V2 relative to another primary charge I1', where the another secondary battery voltage V2 is determined by minus the secondary battery voltage V2 relative to the further secondary charge I2 with a secondary battery voltage difference ΔV2 relative to the another primary charge I1'. The discharge battery profile comprises a fourth point which is a secondary battery voltage V2 relative to a primary charge I1, where the primary charge I1 is larger than the another primary charge I1' with a primary step size.

In FIG. 6B, it is illustrated how the processor unit 8 updates the discharge battery profile DBP. The updating of the discharge battery profile comprises replacing a secondary battery voltage V2 of the plurality of secondary battery voltages V2' relative to the primary charge I1 with a new battery voltage Vnew relative to the primary charge I1, such as the first primary charge I11 or the second primary charge I21, and wherein the new battery voltage Vnew is determined by subtracting a secondary battery voltage V2 of the plurality of secondary battery voltages V2' relative to another primary charge I1' with the new battery voltage difference ΔVnew relative to the primary charge I1, wherein the primary charge I1 is larger than the another primary charge I1'.

Figure 7:
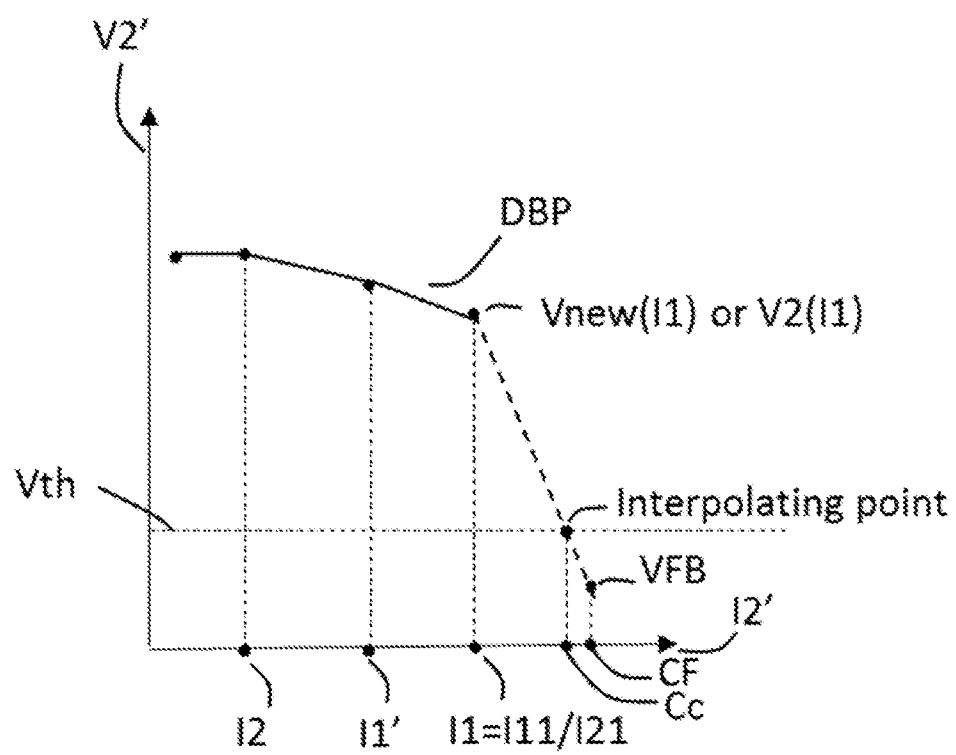
FIG. 7 illustrates an example of extrapolating a final battery voltage.

FIG. 7 illustrates the method of determining a charge capacity Cc of the battery 2. Firstly, determine whether the new battery voltage Vnew relative to the primary charge I1 is larger than a dormant voltage threshold Vth, then extrapolating a final battery voltage VFB at a relative final charge (CF), and interpolating between the new battery voltage Vnew and the final battery voltage VFB the charge capacity Cc of the battery at the dormant voltage threshold Vth. If the charge capacity is larger than a maximum charge capacity, then set the interpolated charge capacity Cc to the maximum charge capacity.

A remaining battery capacity is estimated by the ratio between the primary charge I1 relative to the new battery voltage Vnew and the charge capacity Cc of the battery 2.

The invention claimed is:

1. A method for updating a discharge battery profile (DBP) of a battery during a plurality of discharge steps, wherein the discharge battery profile (DBP) comprises a plurality of secondary battery voltages (V2') and a plurality of secondary charges (I2'), where the plurality of the secondary battery voltages includes measured battery voltage values at different secondary charge values (I2) of the plurality of secondary charges (I2'), and where the discharge battery profile is stored in a storing unit, the method comprising;
receiving during a first discharge step of the plurality of discharge steps a first primary battery voltage (V11) from a voltage monitor unit,
receiving during the first discharge step a first primary charge (I11) from a charge monitor unit or a storing unit,
determining a first secondary charge (I12), where the first secondary charge (I12) is one or more discharge steps lower than the first primary charge (I11),
determining a first secondary battery voltage difference (ΔV12) to be equal to a secondary battery voltage difference (ΔV2) of a plurality of secondary battery voltage differences (ΔV2') relative to the first secondary charge (I12), wherein the plurality of secondary battery voltage differences (ΔV2') is stored in the storing unit,
determining a first secondary battery voltage (V12) to be equal to a secondary battery voltage (V2) of the plurality of secondary battery voltages (V2') relative to the first secondary charge (I12),
determining a first primary battery voltage difference (ΔV11) between the first secondary battery voltage (V12) and the first primary battery voltage (V11),
determining a new battery voltage difference (ΔVnew) based on a first weight (W1) of the first primary battery voltage difference (ΔV11) and a second weight (W2) of the first secondary battery voltage difference (ΔV12), and
updating the discharge battery profile (DBP) with the new battery voltage difference (ΔVnew).

2. The method according to claim 1, receiving the first primary charge (I11) from the storing unit, and wherein the first primary charge (I11) is equal to a secondary charge (I2) of the plurality of secondary charges (I2') relative to the first primary voltage (V11), then the method further comprising:
receiving a second primary charge (I21) from a charge monitor unit during a second discharge step of the plurality of discharge steps, wherein the second primary charge (e) is larger than the first primary charge (I11),
receiving a second primary battery voltage (V21) from the voltage monitor unit during the second discharge step, r
determining the first primary battery voltage difference (ΔV11) between the first secondary battery voltage (V12) and the second primary battery voltage (V21) during or after the second discharge step, and
determining the new battery voltage difference (ΔVnew) and updating the discharge battery profile (DBP) with the new battery voltage difference (ΔVnew) relative to the second primary charge (I21).

3. A method according to claim 1, wherein the updating of the discharge battery profile (DBP) comprising;
replacing a secondary battery voltage (V2) of the plurality of secondary battery voltages (V2') relative to a primary charge (I1) with a new battery voltage (Vnew) relative to the primary charge (I1), such as the first primary charge (I11) or the second primary charge (I21),
determining another primary charge (I1') by subtracting one or more discharge steps of the primary charge (I1), and
wherein the new battery voltage (Vnew) is determined by subtracting a secondary battery voltage (V2) of the plurality of secondary battery voltages (V2') relative to the another primary charge (I1') with the new battery voltage difference (ΔVnew) relative to the primary charge (I1).

4. A method according to claim 1, wherein the first weight (W1) and the second weight (W2) are changing relative to a ratio between a primary battery voltage (V1, V11, V21), such as the first primary battery voltage (V11) or the second primary battery voltage (V21), and a secondary battery voltage (V2, V12, V22) of the plurality of secondary battery voltages (V2'), such as the first secondary battery voltage (V12) or the second secondary battery voltage (V22).

5. A method according to claim 1, wherein the first weight (W1) increases and the second weight (W2) decreases when a primary battery voltage (V1), such as the first primary battery voltage (V11) or the second primary battery voltage (V21), is larger than a secondary battery voltage (V2) of the plurality of secondary battery voltages (V2'), and wherein the first weight (W1) decreases and the second weight (W2) increases when the primary battery voltage (V1) is smaller than the secondary battery voltage (V2) of the plurality of secondary battery voltages (V2').

6. A method according to claim 1, wherein the determining of the new battery voltage difference (ΔVnew) is based on an equation defined as:

$$\Delta V\text{new}[n]=1/\alpha * \Delta V1[n]+(1-\alpha)/\alpha * \Delta V2[n-1],$$

where n is a number of discharge steps, where the number of discharge steps is between 0.1 Coulomb to 10 Coulomb, ΔVnew[n] is the new battery voltage difference, ΔV1[n] is a primary battery voltage difference, such as the first primary battery voltage difference (ΔV11), ΔV2[n−1] is a secondary battery voltage difference, such as the first secondary battery voltage difference (ΔV12), 1/α is the first weight (W1) and (1−α)/α is the second weight (W2), and α is a constant.

7. A method according to claim 3, wherein determining of a charge capacity (Cc) of the battery comprising;
determining whether the new battery voltage (Vnew) relative to the primary charge (I1) is larger than a dormant voltage threshold (Vth), where the dormant voltage threshold (Vth) is received from the storing unit,
extrapolating a final battery voltage (VFB) at a relative final charge (CF), where the relative final charge (CF) is received from the storing unit, and
interpolating the charge capacity (Cc) at the dormant voltage threshold (Vth) between the new battery voltage (Vnew) and the final battery voltage (VFB).

8. A method according to claim 7, wherein a remaining battery capacity is estimated by the ratio between the primary charge (I1) relative to the new battery voltage (Vnew) and the charge capacity (Cc) of the battery.

9. A method according to claim 1, wherein the determining of the new battery voltage difference (ΔVnew) comprises a temperature correction coefficient for correcting an offset in the new battery voltage difference (Vnew).

10. A method according to claim 1, comprising measuring or estimating of a temperature at the battery, and the updating of the discharge battery profile (DBP) stops when the temperature is below a minimum temperature threshold.

11. A hearing aid configured to compensate a hearing loss of a user wearing the hearing aid, wherein the hearing aid comprises,
    a microphone configured to receive an acoustical signal and convert the acoustical signal into an audio signal,
    a processor unit configured to process the audio signal with a hearing loss profile of the user,
    a speaker unit configured to emit the processed audio signal with the hearing loss profile into the ear of the user,
    a voltage monitor unit configured to measure and transmit a primary battery voltage (V11, V21),
    a charge monitor unit configured to measure and transmit a primary charge (I11, I21),
    a storing unit,
and wherein the processor unit is configured to perform the method (100) according to claim 1.

12. A hearing aid according to claim 11, comprising a temperature sensor, and wherein the hearing aid is configured to determine the new battery voltage difference (ΔVnew) using a temperature correction coefficient for correcting an offset in the new battery voltage difference (Vnew).

13. An integrated circuit configured to perform the method according to claim 1.

14. A method according to claim 2, wherein the updating of the discharge battery profile (DBP) comprising;
    replacing a secondary battery voltage (V2) of the plurality of secondary battery voltages (V2') relative to a primary charge (I1) with a new battery voltage (Vnew) relative to the primary charge (I1), such as the first primary charge (I11) or the second primary charge (I21),
    determining another primary charge (I1') by subtracting one or more discharge steps of the primary charge (I1), and
wherein the new battery voltage (Vnew) is determined by subtracting a secondary battery voltage (V2) of the plurality of secondary battery voltages (V2') relative to the another primary charge (I1') with the new battery voltage difference (ΔVnew) relative to the primary charge (I1).

15. A method according to claim 2, wherein the first weight (W1) and the second weight (W2) are changing relative to a ratio between a primary battery voltage (V1, V11, V21), such as the first primary battery voltage (V11) or the second primary battery voltage (V21), and a secondary battery voltage (V2, V12, V22) of the plurality of secondary battery voltages (V2'), such as the first secondary battery voltage (V12) or the second secondary battery voltage (V22).

16. A method according to claim 3, wherein the first weight (W1) and the second weight (W2) are changing relative to a ratio between a primary battery voltage (V1, V11, V21), such as the first primary battery voltage (V11) or the second primary battery voltage (V21), and a secondary battery voltage (V2, V12, V22) of the plurality of secondary battery voltages (V2'), such as the first secondary battery voltage (V12) or the second secondary battery voltage (V22).

17. A method according to claim 2, wherein the first weight (W1) increases and the second weight (W2) decreases when a primary battery voltage (V1), such as the first primary battery voltage (V11) or the second primary battery voltage (V21), is larger than a secondary battery voltage (V2) of the plurality of secondary battery voltages (V2'), and wherein the first weight (W1) decreases and the second weight (W2) increases when the primary battery voltage (V1) is smaller than the secondary battery voltage (V2) of the plurality of secondary battery voltages (V2').

18. A method according to claim 3, wherein the first weight (W1) increases and the second weight (W2) decreases when a primary battery voltage (V1), such as the first primary battery voltage (V11) or the second primary battery voltage (V21), is larger than a secondary battery voltage (V2) of the plurality of secondary battery voltages (V2'), and wherein the first weight (W1) decreases and the second weight (W2) increases when the primary battery voltage (V1) is smaller than the secondary battery voltage (V2) of the plurality of secondary battery voltages (V2').

19. A method according to claim 4, wherein the first weight (W1) increases and the second weight (W2) decreases when a primary battery voltage (V1), such as the first primary battery voltage (V11) or the second primary battery voltage (V21), is larger than a secondary battery voltage (V2) of the plurality of secondary battery voltages (V2'), and wherein the first weight (W1) decreases and the second weight (W2) increases when the primary battery voltage (V1) is smaller than the secondary battery voltage (V2) of the plurality of secondary battery voltages (V2').

20. A method according to claim 2, wherein the determining of the new battery voltage difference (ΔVnew) is based on an equation defined as:

$$\Delta Vnew[n]=1/\alpha*\Delta V1[n]+(1-\alpha)/\alpha*\Delta V2[n-1],$$

where n is a number of discharge steps, where the number of discharge steps is between 0.1 Coulomb to 10 Coulomb, ΔVnew[n] is the new battery voltage difference, ΔV1[n] is a primary battery voltage difference, such as the first primary battery voltage difference (ΔV11), ΔV2[n−1] is a secondary battery voltage difference, such as the first secondary battery voltage difference (ΔV12), 1/α is the first weight (W1) and (1−α)/α is the second weight (W2), and α is a constant.

* * * * *